(12) United States Patent
Okada

(10) Patent No.: US 7,576,327 B2
(45) Date of Patent: Aug. 18, 2009

(54) RADIATION IMAGE DETECTOR AND DRIVING METHOD FOR THE SAME

(75) Inventor: Yoshihiro Okada, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 11/871,274

(22) Filed: Oct. 12, 2007

(65) Prior Publication Data

US 2008/0087835 A1    Apr. 17, 2008

(30) Foreign Application Priority Data

Oct. 12, 2006    (JP)    ............................. 2006-278410

(51) Int. Cl.
*G01T 1/24*    (2006.01)
(52) U.S. Cl. ................................. 250/370.09
(58) Field of Classification Search ............ 250/370.09, 250/370.02, 370.08, 395, 208.1, 370.11, 250/370.1, 370.14, 336.1, 370.01
See application file for complete search history.

(56) References Cited

U.S. PATENT DOCUMENTS

| 5,869,837 | A  | * | 2/1999  | Huang ................... 250/370.09 |
| 5,962,856 | A  | * | 10/1999 | Zhao et al. ............. 250/370.09 |
| 6,453,008 | B1 | * | 9/2002  | Sakaguchi et al. ......... 378/98.7 |
| 6,718,010 | B2 | * | 4/2004  | Petrick et al. ............... 378/98.8 |
| 6,995,373 | B2 | * | 2/2006  | Ishii et al. ............... 250/370.08 |
| 7,009,663 | B2 | * | 3/2006  | Abileah et al. ................. 349/12 |
| 7,119,341 | B2 | * | 10/2006 | Petrick ................... 250/370.09 |
| 7,132,667 | B2 | * | 11/2006 | Petrick et al. ........... 250/370.09 |
| 7,470,911 | B2 | * | 12/2008 | Yagi ....................... 250/370.14 |
| 2006/0192130 | A1 | * | 8/2006 | Yagi ....................... 250/370.14 |

FOREIGN PATENT DOCUMENTS

JP    2005-111651 A    4/2005

* cited by examiner

*Primary Examiner*—David P Porta
*Assistant Examiner*—Djura Malevic
(74) *Attorney, Agent, or Firm*—Sughrue Mion, PLLC

(57) ABSTRACT

A radiation image detector including the following layers stacked on top of another: a charge generation layer that generates charges by receiving radiation; and a detection layer which includes: multitudes of pixels, each having a collection electrode for collecting charges generated in the charge generation layer, a storage capacitor for storing charges collected by the collection electrode, and a TFT switch for reading out charges stored in the storage capacitor; multitudes of scanning lines for switching ON/OFF the TFT switches; and multitudes of data lines through which charges stored in the storage capacitors are read out. Here, each of the storage capacitors is formed between a storage capacitor electrode connected to the drain electrode of a TFT switch and the scanning line connected to a TFT switch adjacent to the TFT switch to which the drain electrode belongs.

11 Claims, 6 Drawing Sheets

RADIATION IMAGE DETECTOR AND DRIVING METHOD FOR THE SAME

BACKGROUND OF THE INVENTION

1. Field of the Invention

The present invention relates to a radiation image detector which includes the following layers stacked on top of another: a charge generation layer that generates charges by receiving radiation; and a detection layer in which multitudes of pixels, each having a TFT switch, are disposed two dimensionally, and a driving method for driving the same. In particular, the present invention relates to a layout of the pixels.

2. Description of the Related Art

Recently, flat panel detectors (FPDs) have been put into practical use. FPD includes an X-ray sensitive layer on a TFT active matrix array and is capable of directly converting X-ray information to digital data. It has advantages over conventional imaging plates in that it allows instantaneous image verification and checking for motion images, and is spreading rapidly.

First, the configuration of a conventional radiation image detector will be described with reference to FIG. 7.

In the conventional radiation image detector, a semiconductor layer 20 which is conductive for electromagnetic waves is formed on an active matrix substrate 10 having collection electrodes 8 disposed in an array, and an upper electrode 22 is formed on the semiconductor layer 20, as illustrated in FIG. 7. The upper electrode 22 is connected to a high voltage power source 24. The semiconductor film 20 is a selenium-based amorphous a-Se film with a thickness of 100 to 1000 µm, and generates charges inside of the film when exposed to X-rays. A TFT switch 3 and a storage capacitor 4 are provided adjacent to each of collection electrodes 8 disposed on the active matrix substrate 10 in an array. The drain electrode 7 of the TFT switch 3 is connected to one of the electrodes of the storage capacitor 4. The other electrode of the storage capacitor 4 is connected to a storage capacitor wire 12. A scanning line 1 is connected to the gate electrode 2 of the TFT switch 3, and a data line 5 is connected to the source electrode 6. An amplifier 23 is connected to the end of the data line 5.

The operational principle of the conventional radiation image detector will be described next.

When X-rays are irradiated from above in FIG. 7, the semiconductor film 20 generates charges inside thereof. Holes of the charges generated in the semiconductor film 20 are collected to each collection electrode 8 due to a bias between the upper electrode 22 and collection electrode 8, and stored in the storage capacitor 4 electrically connected to the collection electrode 8. The semiconductor film 20 generates different amounts of charges depending on the X-ray dosage, so that an amount of charges depending on image information represented by the X-rays is stored in the storage capacitor 4 of each pixel. Thereafter, a signal for switching ON each TFT switch 3 is sequentially applied through each scanning line 1, and charges stored in each storage capacitor 4 are read out through each data line 5. Then, the amount of charges of each pixel is detected by each amplifier 23, thereby the image information is read out.

Here, in the currently available radiation image detectors, the common pixel size is around 100 to 300 µm square. In order to improve image quality of X-ray images, a finer pixel resolution is demanded.

The pixel size, however, is practically limited to around 100 µm square due to restrictions arising from the TFT array structure. The reason for this will be described with reference to a layout chart of the conventional radiation image detector shown in FIG. 8. In the conventional TFT layout structure, a storage capacitor wire 12 is disposed between the scanning lines 1 along them in order to form the storage capacitor 4. The storage capacitor wire is formed of the same layer metal as the scanning line 1 in order to reduce production costs.

Here, for example, assuming to realize a radiation image detector with a pixel pitch of 50 µm using the aforementioned pixel layout. If the width of the scanning line 1 and storage capacitor wire 12 is 12 µm, then the distance available between the scanning line 1 and storage capacitor wire 12 is only 13 µm. As described above, the scanning line 1 and storage capacitor wire 12 are on the same layer, so that the decrease in the distance between them leads to decrease in the yield rate due to increase in interline leaks. Formation of the scanning lines and storage capacitor wires in different layers additionally requires a wiring layer and an insulation layer. This is not practical because of a significant increase in the production costs.

In view of the circumstances described above, it is an object of the present invention to provide a radiation image detector with a fine pixel pitch of around 50 µm without a significant decrease in the yield rate.

SUMMARY OF THE INVENTION

The radiation image detector of the present invention is a radiation image detector including the following layers stacked on top of another:

a charge generation layer that generates charges by receiving radiation; and a detection layer including: multitudes of pixels, each having a collection electrode for collecting charges generated in the charge generation layer, a storage capacitor for storing charges collected by the collection electrode, and a TFT switch for reading out charges stored in the storage capacitor; multitudes of scanning lines for switching ON/OFF the TFT switches; and multitudes of data lines through which charges stored in the storage capacitors are read out, wherein each of the storage capacitors is formed between a storage capacitor electrode connected to the drain electrode of a TFT switch and the scanning line connected to a TFT switch adjacent to the TFT switch to which the drain electrode belongs.

In the radiation image detector of the present invention, an arrangement may be adopted in which the collection electrode covers a portion of the scanning line through an insulation film.

Further, an arrangement may be adopted in which the storage capacitor electrodes are alternately disposed above or below the scanning lines with respect to each data line.

Still further, an arrangement may be adopted in which the width of the storage capacitor electrode is greater than the width of the scanning line, and both ends of the storage capacitor electrode are protruding from the scanning line.

Further, an arrangement may be adopted in which the width of the storage capacitor electrode is smaller than the width of the scanning line, and both ends of the storage capacitor electrode are not protruding from the scanning line.

Still further, an arrangement may be adopted in which the collection electrode covers the storage capacitor electrode.

Further, an arrangement may be adopted in which a wiring pitch Pgg of the scanning lines and a width Wg of the scanning line satisfy Formula (1) below:

$$(Pgg - 2Wg)/2 \leq 25 \, \mu m \quad (1)$$

The driving method of the present invention is a method for driving the radiation image detector described above, wherein each of the scanning lines is switched ON at a timing preceding the timing at which the scanning line disposed in the lower layer of the storage capacitor electrode electrically connected to the TFT switch to which each of the scanning lines is connected is switched ON.

The radiation image detector of the present invention includes the following layers stacked on top of another: a charge generation layer that generates charges by receiving radiation; and a detection layer which includes: multitudes of pixels, each having a collection electrode for collecting charges generated in the charge generation layer, a storage capacitor for storing charges collected by the collection electrode, and a TFT switch for reading out charges stored in the storage capacitor; multitudes of scanning lines for switching ON/OFF the TFT switches; and multitudes of data lines through which charges stored in the storage capacitors are read out. Here, each of the storage capacitors is formed between a storage capacitor electrode connected to the drain electrode of a TFT switch and the scanning line connected to a TFT switch adjacent to the TFT switch to which the drain electrode belongs. This arrangement does not require storage capacitor wires required in a conventional radiation image detector, so that a pixel pitch of around 50 μm may be realized, and at the same time the scanning line pitch may be increased. This reduces interline leakage faults.

Further, in the radiation image detector of the present invention, if an arrangement is adopted in which the collection electrode covers a portion of the scanning line through an insulation film, the collection electrode over the scanning line may contribute to the fill factor, thereby the fill factor may be improved.

Still further if an arrangement is adopted in which the storage capacitor electrodes are alternately disposed above or below the scanning lines with respect to each data line, the storage capacitance may be increased, and at the same time a certain scanning line pitch may be ensured, thereby the production yield rate may be improved.

Further, if an arrangement may be adopted in which the width of the storage capacitor electrode is made greater than the width of the scanning line, and both ends of the storage capacitor electrode are protruding from the scanning line, variations in the storage capacitance may be reduced even when a misalignment occurs in the exposure equipment by making the protruded amount greater than the alignment margin of the exposure equipment.

Still further, if an arrangement is adopted in which the width of the storage capacitor electrode is made smaller than the width of the scanning line, and both ends of the storage capacitor electrode are not protruding from the scanning line, variations in the storage capacitance may be reduced even when a misalignment occurs in the exposure equipment by making the inwardly receded amount of each end of the storage capacitor electrode with respect to the scanning line greater than the alignment margin of the exposure equipment.

Further, if an arrangement is adopted in which the collection electrode covers the storage capacitor electrode, the region of the storage capacitor electrode may contribute to the fill factor, thereby the fill factor may be improved.

DESCRIPTION OF THE PREFERRED EMBODIMENTS

Hereinafter, a first embodiment of the radiation image detector of the present invention will be described with reference to the accompanying drawings.

A flat panel image sensor, as the radiation image detector of the present embodiment, is an image sensor capable of detecting an image represented by X-rays or the like, and is used, for example, in X-ray imaging equipment that creates a picture of an X-ray image transmitted through a human body or the like. It is noted that the radiation image detector of the present invention is not necessarily limited to the flat panel type, and includes an image sensor with a curved surface substrate.

Figure 2:
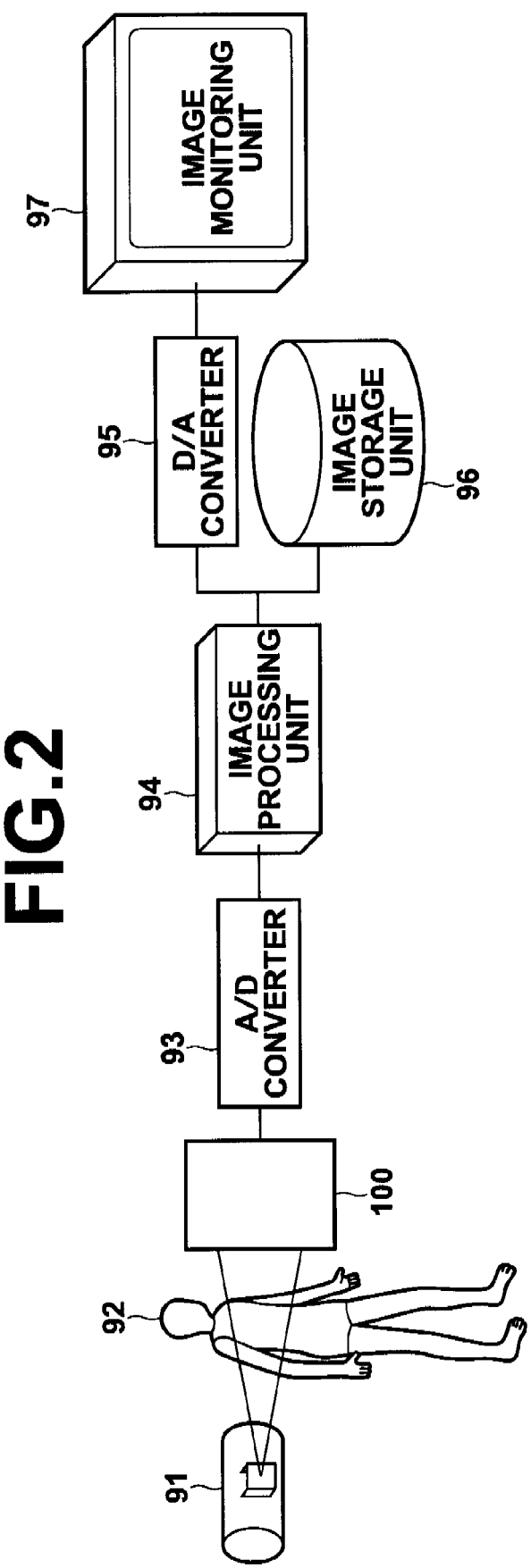
FIG. 2 illustrates an example application of the radiation image detector of the present invention.

That is, for example, an X-ray transmission image of a subject 92 formed by X-rays outputted from an X-ray tube 91 is converted to image signals by a radiation image detector 100 of the present embodiment, in which photoelectric conversion elements are disposed in a two dimensional array, as illustrated in FIG. 2.

Analog image signals outputted from the radiation image detector 100 are converted to digital image signals through an A/D converter 93, and inputted to an image processing unit 94. The image processing unit 94 causes an image storage unit 96 to store an image to be preserved, as well as performing various types of image processing. Digital image signals outputted from the image processing unit 94 are converted to analog image signals through a D/A converter 95 and may be displayed on the screen of an image monitoring unit 97.

Figure 1:
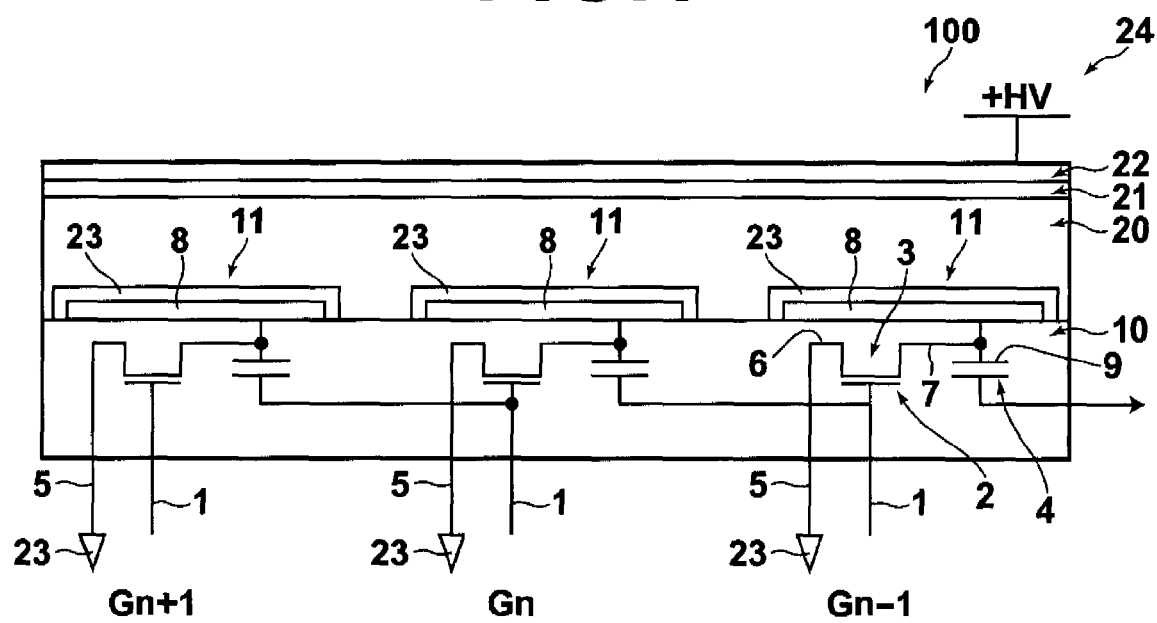
FIG. 1 is a schematic configuration diagram of the radiation image detector according to a first embodiment of the present invention.

FIG. 1 illustrates a schematic configuration of the radiation image detector 100 according to the first embodiment.

The radiation image detector 100 according to the present embodiment includes an active matrix substrate 10, a semiconductor film 20 formed on substantially the entire surface of the active matrix substrate 10, a dielectric layer 21, an upper electrode 22, and an electron blocking layer 23 provided on a collection electrode 8 to be describe later, as illustrated in FIG. 1.

The semiconductor film 20 has conductivity for electromagnetic waves, and generates charges inside of the film when exposed to X-rays. As for the semiconductor film 20, for example, a selenium-based amorphous a-Se film with a thickness of 100 to 1000 μm may be used. The semiconductor film 20 is formed with a thickness of, for example, 300 to 1000 μm by a vacuum deposition method.

The dielectric layer 21 and electron blocking layer 23 are for preventing charges from being stored in a storage capacitor 4, to be described later, caused by leak currents when X-rays are irradiated, and provided as required.

That is, the dielectric layer 21 prevents charges from entering into the semiconductor film 20 from the upper electrode 22 when an operation voltage is applied to the upper electrode 22, while the electron blocking layer 23 prevents charges from entering into the semiconductor film 20 from the collection electrode 8. This may improve the resolution of an X-ray image by preventing leak currents.

The upper electrode 22 is formed of a low resistance conductive material, such as Au, Al or the like, and connected to a high voltage power source 24.

The active matrix substrate 10 includes: multitudes of pixels 11, each having a collection electrode 8 for collecting the charges generated in the semiconductor film 20, a storage capacitor 4 for storing the charges collected by the collection electrode 8, and a TFT switch 3 for reading out the charges stored in the storage capacitor 2; multitudes of scanning lines 1 for switching ON/OFF the TFT switches 3; and multitudes of data lines 5 through which charges stored in the storage capacitors 4 are read out. The pixels 11 are disposed in an array.

As for the TFT switch 3, an a-Si TFT using amorphous silicon in the active layer is generally used. A scanning line 1 for switching ON/OFF the TFT switch 3 is connected to the gate electrode 2 of the TFT switch 3, and a data line 5, through which charges stored in the storage capacitor 4 are read out, is connected to the source electrode 6. A storage capacitor electrode 9, which is one of the electrodes forming the storage capacitor 4 is connected to the drain electrode 7. The other electrode of the storage capacitor 4 is connected to the scanning line 1 connected to the TFT switch 3 of a pixel 11 adjacent to the pixel 11 to which the storage capacitor 4 belongs.

An amplifier 23 is connected to the end of the data line 5.

Figure 3:
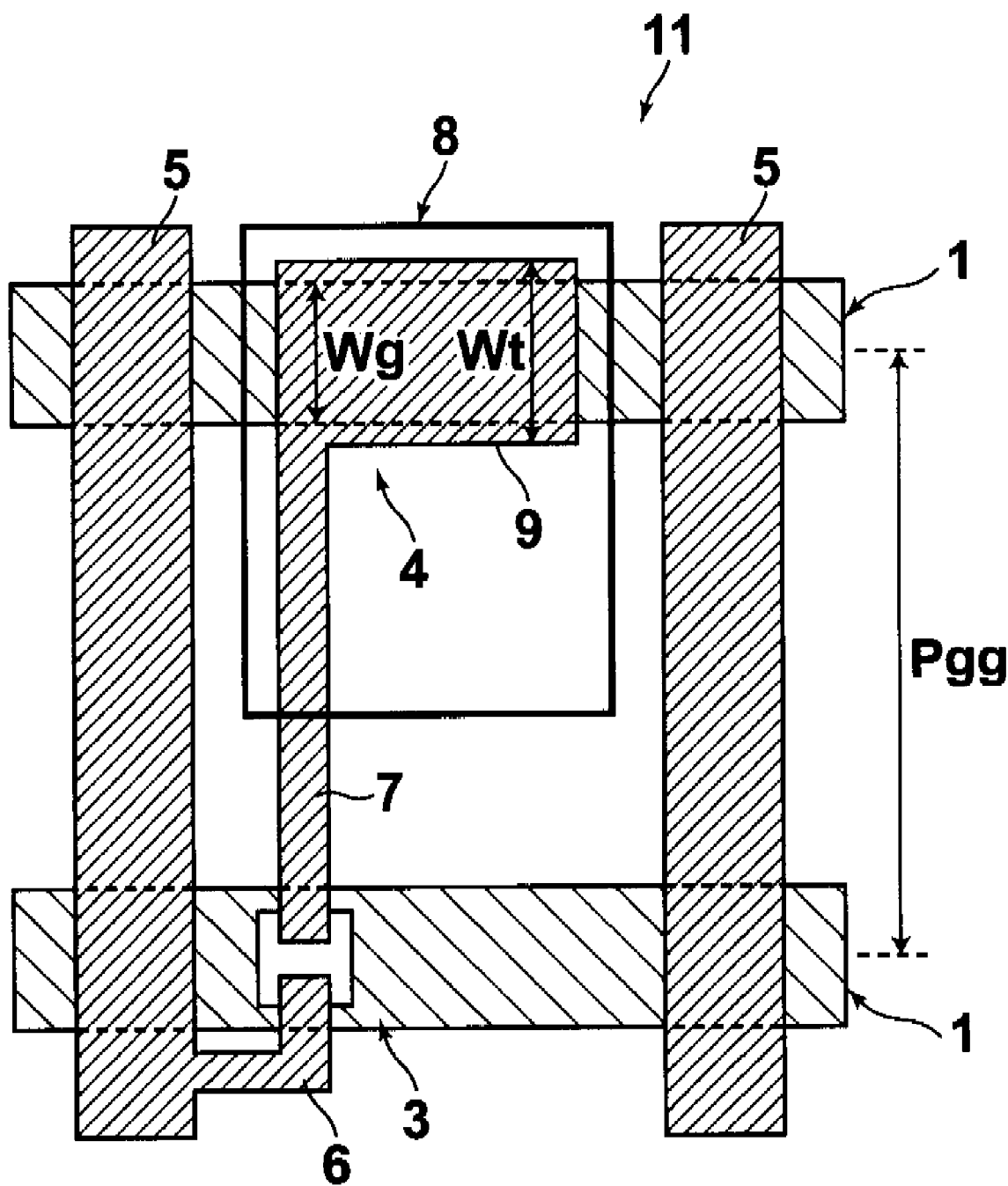
FIG. 3 illustrates a pixel layout of the radiation image detector according to the first embodiment.

A layout of the pixel 11 of the radiation image detector according to the present embodiment is shown in FIG. 3.

As illustrated in FIG. 3, a scanning line 1 and a data line 5 which is orthogonal to the scanning line 1 are disposed around each pixel 11. A TFT switch 3 is disposed adjacent to the intersection between the scanning line 1 and data line 5. The source electrode of the TFT switch 3 is connected to the data line 5, and the drain electrode 7 is connected to the storage capacitor electrode 9. The storage capacitor electrode 9 is connected to a collection electrode 8 through a contact hole. The storage capacitor electrode 9 is disposed so as to overlap with the scanning line 1 through an insulation film. A storage capacitor 4 is formed by the storage capacitor electrode 9 and scanning line 1. That is, the scanning line 1 functions not only as a scanning line but also as a storage capacitor electrode.

The collection electrode 8 is disposed so as to cover a portion of the scanning line 1. This allows the ratio of the collection electrode 8 to the region of the pixel 11 (fill factor) to be increased.

The collection electrode 8 entirely covers the storage capacitor 4. This allows the region of the storage capacitor 4 to function as the fill factor.

Preferably, the width Wt of the storage capacitor electrode 9 is greater than the width Wg of the scanning line 1, and both ends of the storage capacitor electrode 9 are protruding from the scanning line 1. This may prevent the change in the storage capacitance even if a misalignment occurs in the photo process. It is noted that the width Wt of the storage capacitor electrode 9 may be made smaller than the width Wg of the scanning line 1, and not protruding from the scanning line 1.

Preferably, a wiring pitch Pgg of the scanning lines 1 and a width Wg of the scanning line 1 satisfy Formula (1) shown below.

$$(Pgg - 2Wg)/2 \leq 25 \, \mu m \tag{1}$$

Where Formula (1) is satisfied, the line gap of the storage capacitor wires becomes equal to or less than 25 μm when disposed. In TFT production lines, if the line gap becomes equal to or less than 25 μm, leakage faults occur frequently. Further, in repair devices, such as a laser repair device and the like, a repair operation can not be performed if the line gap is 20 to 25 μm. Thus, the advantage of the adoption of the structure described above becomes more significant where the pixel size satisfies Formula (1) above.

Next, the operational principle of the radiation image detector according to the present embodiment will be described.

When X-rays are irradiated from above in FIG. 1, the semiconductor film 20 generates charges inside thereof. Holes of the charges generated in the semiconductor film 20 are collected to each collection electrode 8 due to a bias between the upper electrode 22 and collection electrode 8, and stored in the storage capacitor 4 electrically connected to the collection electrode 8. The semiconductor film 20 generates different amounts of charges depending on the X-ray dosage, so that an amount of charges depending on image information represented by the X-rays is stored in the storage capacitor 4 of each pixel.

Thereafter, a signal for switching ON each TFT 3 is sequentially applied through each scanning line 1, and charges stored in each storage capacitor 4 are read out through each data line 5. Then, the amount of charges of each pixel 11 is detected by each amplifier 23, thereby the image information is read out.

Figure 4:
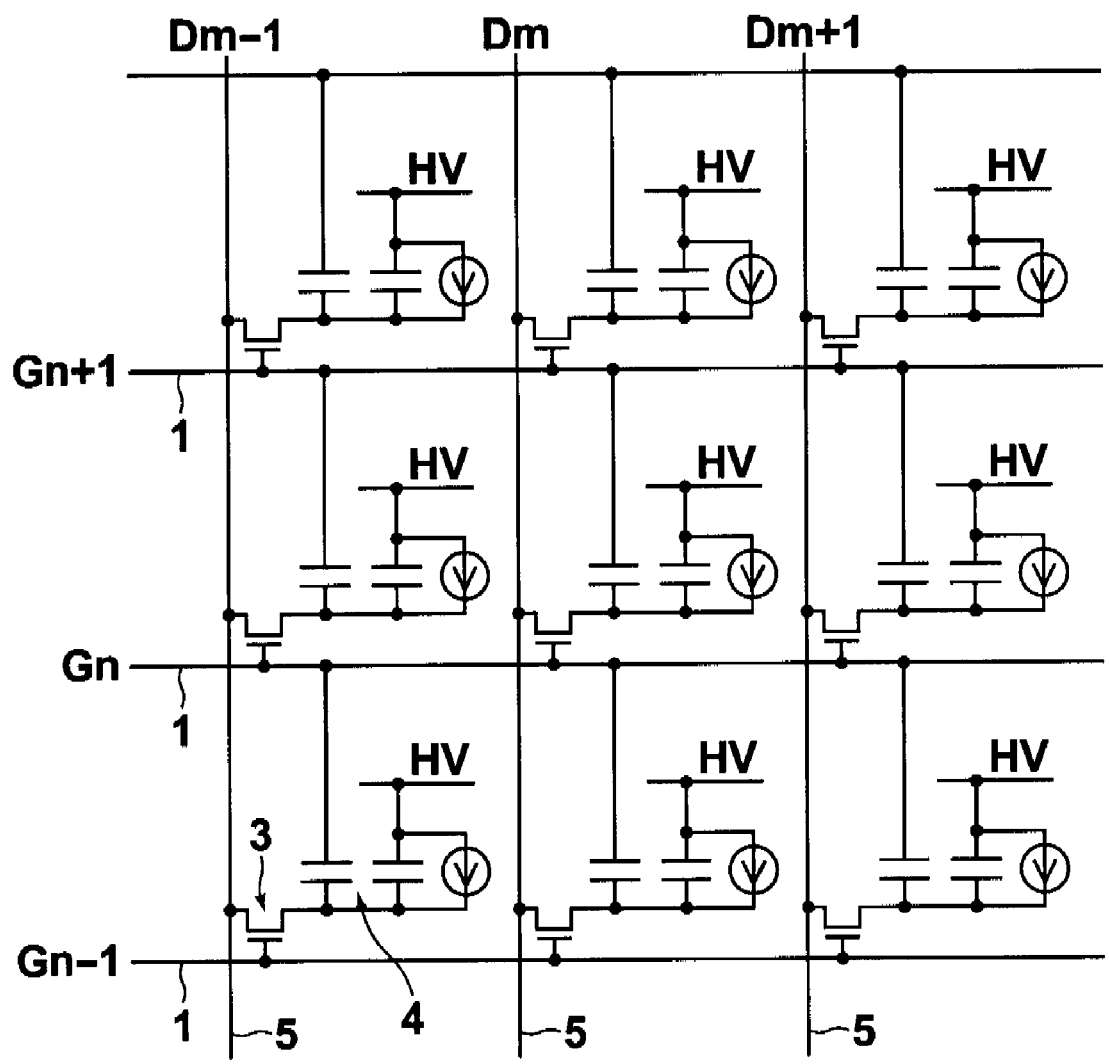
FIG. 4 is an equivalent circuit diagram of the radiation image detector according to the first embodiment of the present invention.

The method for driving the radiation image detector according to the present embodiment will be described with reference to the equivalent circuit diagram of FIG. 4.

First, X-ray image data are recorded in the radiation image detector by irradiating X-rays as described above. Charges generated in the semiconductor film 20 according to the X-ray dosage are collected by each collection electrode 8 and stored in the storage capacitor 4 electrically connected to the collection electrode 8. Then, an ON signal is sequentially inputted to the scanning lines 1 in the order of Gn−1, Gn, Gn+1. In FIG. 4, the scanning lines 1 are scanned from bottom to upward. That is, each scanning line 1 is switched ON at a timing preceding the timing at which the scanning line 1 disposed in the lower layer of the storage capacitor electrode 9 electrically connected to the TFT switch 3 to which each scanning line 1 is connected is switched ON. In response to this, charges stored in the storage capacitor 4 of each pixel 11 are outputted to the data lines Dm−1, Dm, and Dm+1, and detected by the not shown amplifiers.

In the radiation image detector according to the present embodiment, scanning direction of the scanning lines is particularly important. If the scanning direction is opposite to the direction described above, the potential of the scanning line 1 coupled through the storage capacitor 4 is changed before data is detected, and the potential of the charges stored in the storage capacitor 4 is varied. Therefore, it is preferable that the scanning be performed in the order described above in order to reduce noise in the detected image data.

Next, the radiation image detector according to a second embodiment will be described. The radiation image detector according to the present embodiment is identical in general configuration to the radiation image detector according to the first embodiment, but differs in pixel layout.

Figure 5:
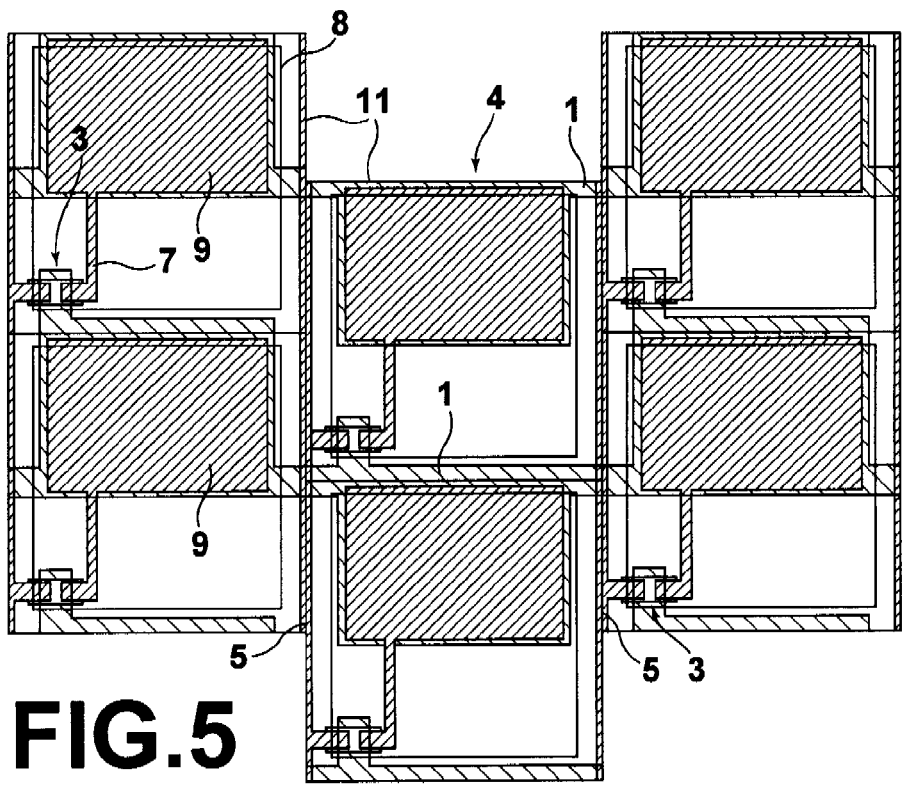
FIG. 5 illustrates a pixel layout of the radiation image detector according to a second embodiment of the present invention.
Figure 6:
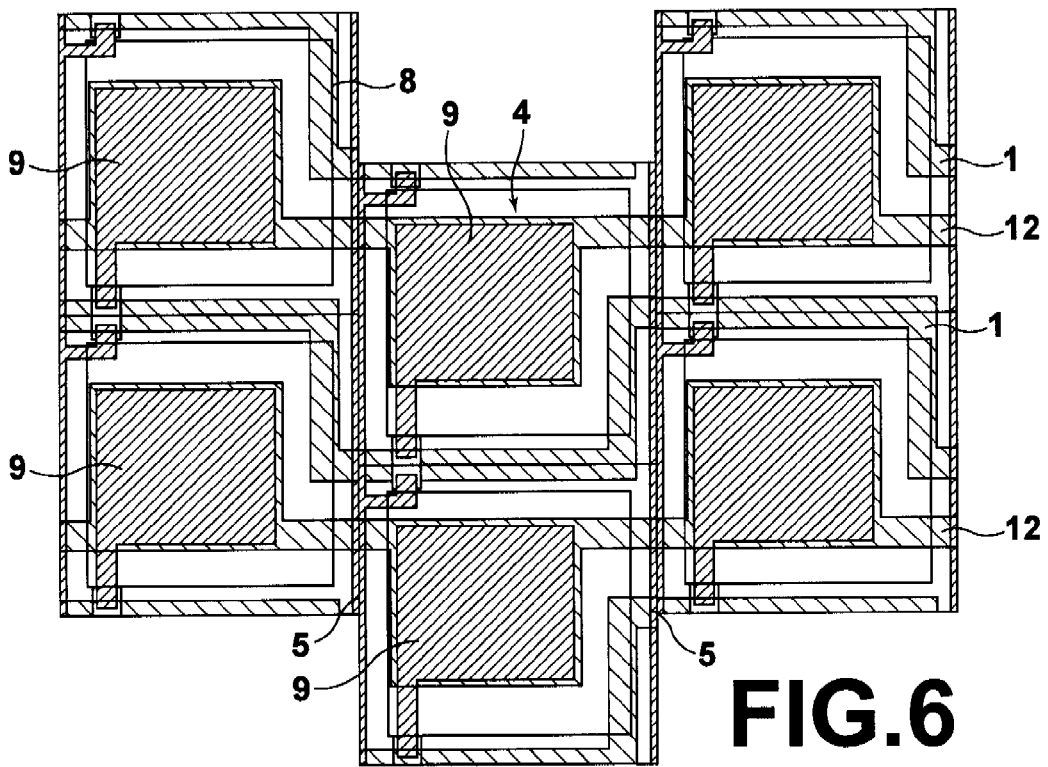
FIG. 6 illustrates a pixel layout of a conventional radiation image detector.
Figure 7:
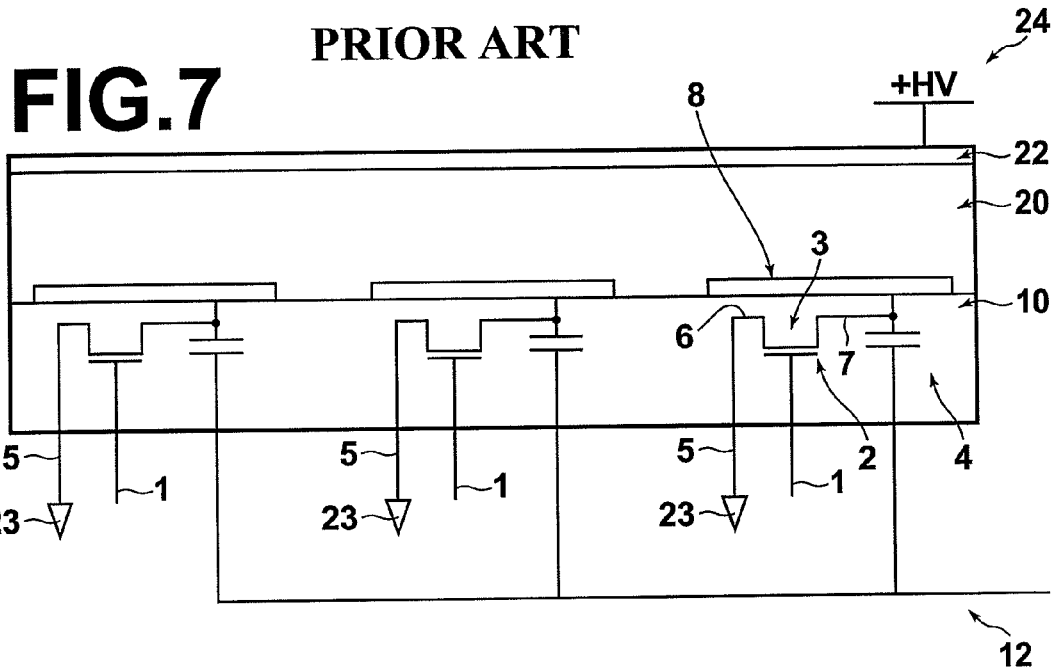
FIG. 7 is a schematic configuration diagram of the conventional radiation image detector.
Figure 8:
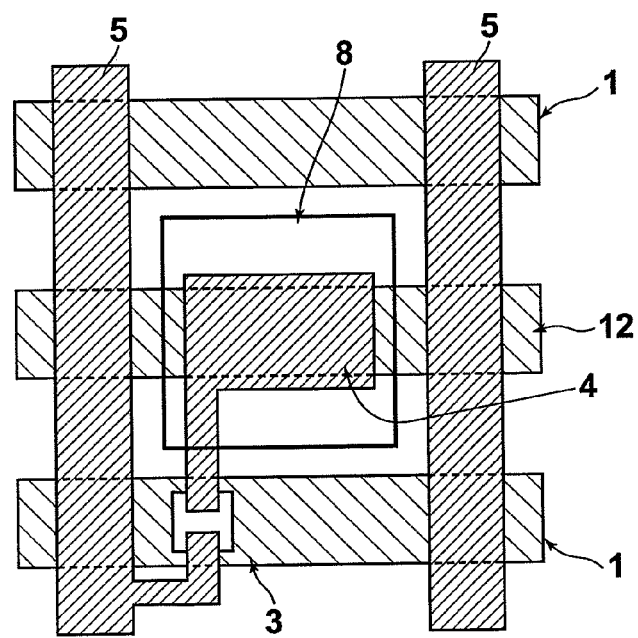
FIG. 8 illustrates a pixel layout of the conventional radiation image detector.

In the radiation image detector according to the present embodiment, pixels 11 are displaced by ½ pitch with respect to each data line to improve effective resolution, as illustrated in FIG. 5. Here, in the radiation image detector according to the present embodiment, the storage capacitor 4 is formed between the storage capacitor electrode 9 connected to a drain electrode 7 and the scanning line 1 connected to a TFT switch 3 adjacent to the TFT switch 3 to which the drain electrode 7 belongs, and lower electrodes of the storage capacitors 4 extending from the scanning lines 1 are displaced up and down with respect to each data line 5. That is, the storage capacitor electrodes 9 are disposed alternately above or below the scanning lines 1 with respect to each data line 5. This may largely increase the area of the storage capacitor 4 in comparison with a conventional structure in which the storage capacitor 4 is formed between the storage capacitor wire and storage capacitor electrode. The amount of charges stored in the radiation image detector is proportional to the area of the storage capacitor 4, so that the dynamic range of the radiation image detector may be increased. FIG. 6 illustrates the conventional structure in which the storage capacitor 4 is formed between the storage capacitor wire 12 and storage capacitor electrode 9. In the conventional radiation image detector, the scanning line 1 is curved as illustrated in FIG. 6, while in the radiation image detector according to the second embodiment illustrated in FIG. 5 the scanning line 1 becomes a straight line, so that the wire is shorter by that much. This allows faster signal detection and noise reduction. Displacement of the storage capacitors to up and down directions as described above ensures a certain scanning line pitch, which in turn increases the production yield rate, and the production cost is eventually reduced.

What is claimed is:

1. A radiation image detector comprising the following layers stacked on top of another:
    a charge generation layer that generates charges by receiving radiation; and
    a detection layer including: multitudes of pixels, each having a collection electrode for collecting charges generated in the charge generation layer, a storage capacitor for storing charges collected by the collection electrode, and a TFT switch for reading out charges stored in the storage capacitor; multitudes of scanning lines for switching ON/OFF the TFT switches; and multitudes of data lines through which charges stored in the storage capacitors are read out,
    wherein each of the storage capacitors is formed between a storage capacitor electrode connected to the drain electrode of a TFT switch and the scanning line connected to a TFT switch adjacent to the TFT switch to which the drain electrode belongs,
    wherein the collection electrodes and the storage capacitor electrodes are formed separately, and the storage capacitor is provided between the collection electrodes and the scanning lines.

2. The radiation image detector of claim 1, wherein the collection electrode covers a portion of the scanning line through an insulation film.

3. The radiation image detector of claim 1, wherein the storage capacitor electrodes are alternately disposed above or below the scanning lines with respect to each data line.

4. The radiation image detector of claim 1, wherein the width of the storage capacitor electrode is greater than the width of the scanning line, and both ends of the storage capacitor electrode are protruding from the scanning line.

5. The radiation image detector of claim 1, wherein the width of the storage capacitor electrode is smaller than the width of the scanning line, and both ends of the storage capacitor electrode are not protruding from the scanning line.

6. The radiation image detector of claim 1, wherein the collection electrode covers the storage capacitor electrode.

7. The radiation image detector of claim 1, wherein a wiring pitch Pgg of the scanning lines and a width Wg of the scanning line satisfy Formula (1) below:

$$(Pgg-2Wg)/2 \leq 25 \, \mu m \quad (1).$$

8. A method for driving the radiation image detector of claim 1, wherein each of the scanning lines is switched ON at a timing preceding the timing at which the scanning line disposed in the lower layer of the storage capacitor electrode electrically connected to the TFT switch to which each of the scanning lines is connected is switched ON.

9. The radiation image detector of claim 1, further comprising:
    an electron blocking layer, which prevents charges from entering the detection layer from the collection electrode,
    wherein the electron blocking layer is formed between the detection layer and the collection electrode.

10. The radiation image detector of claim 1, further comprising:
    an upper electrode; and
    a dielectric layer which prevents charges from the upper electrode from entering into the detection layer,
    wherein the upper electrode is formed on the dielectric layer, and the dielectric layer is formed on the detection layer.

11. The radiation image detector of claim 1, wherein the pixels are displaced by ½ pitch with respect to each data line.

* * * * *